(12) United States Patent
Chen et al.

(10) Patent No.: US 8,487,692 B1
(45) Date of Patent: Jul. 16, 2013

(54) VOLTAGE GENERATOR WITH ADJUSTABLE SLOPE

(75) Inventors: Chih-Ning Chen, Taipei (TW); Yen-Ming Chen, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/594,869

(22) Filed: Aug. 26, 2012

(30) Foreign Application Priority Data

Apr. 25, 2012 (TW) .............................. 101114670 A

(51) Int. Cl.
*G05F 1/10* (2006.01)

(52) U.S. Cl.
USPC ........................................................ 327/538

(58) Field of Classification Search
USPC .................... 327/530, 534–541, 543
See application file for complete search history.

(56) References Cited

U.S. PATENT DOCUMENTS

| 5,245,273 | A  | * | 9/1993 | Greaves et al. | ............... | 323/313 |
| 6,774,711 | B2 | * | 8/2004 | Bernard | ........................ | 327/539 |

* cited by examiner

*Primary Examiner* — Lincoln Donovan
*Assistant Examiner* — Sibin Chen
(74) *Attorney, Agent, or Firm* — Winston Hsu; Scott Margo

(57) ABSTRACT

A charging circuit includes a first current mirror for receiving an input voltage, a second current mirror including a first branch circuit and a second branch circuit for receiving the input voltage, a switch transistor coupled to the first current mirror and the first branch circuit for determining a conduction condition of the switch transistor according to a switch signal, a first resistor including a first resistance and one end coupled to the switch transistor, and a second resistor including a second resistance and one end coupled the second branch circuit of the second current mirror, wherein the first current mirror and the second current mirror perform a charging operation of a loading circuit according to the first resistance and the second resistance.

19 Claims, 14 Drawing Sheets

VOLTAGE GENERATOR WITH ADJUSTABLE SLOPE

BACKGROUND OF THE INVENTION

1. Field of the Invention

The present invention relates to a charging circuit, and more particularly, to a charging circuit which can adjust a charging period and a charging slope and provide a soft start operation.

2. Description of the Prior Art

The prior art usually utilizes a voltage generator to process a charging operation or a soft start operation for a MOS transistor capacitor, a polysilicon capacitor or a passive circuit. Hereinafter, the MOS transistor capacitor is realized by the metal-oxide-semiconductor field-effect transistor (MOSEFT), which is formed from the top to the bottom as a metal layer, which can be replaced by the polycrystalline silicon nowadays, an oxide layer and a P/N-type semiconductor layer to structurally form a MOS-transistor-type capacitor. The oxide layer is the silicon dioxide to be regarded as a dielectric material in the capacitor. Width of the oxide layer and a dielectric constant of the silicon dioxide determine a capacitance of the capacitor. The polycrystalline silicon is utilized to be the gate and the semiconductor is utilized to be the base, which form two terminal ends of the MOS transistor capacitor.

Please refer to FIG. 1A, FIG. 1B and FIG. 2, wherein FIG. 1A illustrates a schematic diagram of a conventional MOS transistor capacitor MOS_C for a charging operation, FIG. 1B illustrates a schematic diagram of different operational conditions of the MOS transistor capacitor MOS_C versus different capacitances, and FIG. 2 illustrates a schematic diagram of a terminal voltage VC1 of the MOS capacitor MOS_C at different timings. As shown in FIG. 1A and FIG. 1B, the MOS transistor capacitor MOS_C utilizes a stable current source CS for continuously charging operation. Due to an incremental voltage value of a gate of the MOS transistor capacitor MOS_C, the MOS transistor capacitor MOS_C changes capacitances thereof between a depletion capacitance C_del and an inversion capacitance C_inv, and the above capacitances correspond to different operational conditions. Please refer to FIG. 2, since the MOS transistor capacitor MOS_C can be either the depletion capacitance C_del or the inversion capacitance C_inv, the terminal voltage VC1 of the MOS transistor capacitor MOS_C corresponds to two lines with different slopes at the threshold voltage Vth, which equals to 0.8 volts. Under such circumstances, dramatically changeable capacitances of the capacitance of the MOS transistor capacitor MOS_C occur nearby the threshold voltage Vth.

Also, the prior art usually utilizes solutions, such as reducing charging currents of the MOS transistor capacitor MOS_C or increasing the capacitance of the MOS transistor capacitor MOS_C, to slow down the charging operation of the MOS transistor capacitor MOS_C to meet different requirements. However, the mentioned two solutions still have problems thereof. For example, if the charging currents are reduced, a leakage current can effectively influence the charging operation of the MOS transistor capacitor MOS_C. Besides, the incremental capacitance of the MOS transistor capacitor MOS_C may results in extra areas needed in circuit layout to increase product cost. Therefore, it has become an important issue to provide another charging circuit for the MOS transistor capacitor to prevent discontinuous charging voltages during the charging operation of the MOS transistor capacitor MOS_C, so as to adaptively provide an adjustable charging slope and an adjustable charging period to be operated as another soft start operation.

SUMMARY OF THE INVENTION

It is therefore an objective of the invention to provide a charging circuit having a charging operation with an adjustable charging slope as well as an adjustable charging period being preformed as a soft start operation.

The present invention discloses a charging circuit comprising a first current mirror for receiving an input voltage, a second current mirror coupled to the first current mirror and comprising a first branch circuit and a second branch circuit for receiving the input voltage, a switch transistor coupled to the first current mirror and the first branch circuit of the second current mirror for determining a conduction condition of the switch transistor according to a switch signal, a first resistor comprising a first resistance, one end coupled to the switch transistor and another end grounded, and a second resistor comprising a second resistance, one end coupled to the second branch circuit of the second current mirror and another end grounded, wherein the first current mirror and the second current mirror are utilized to process a charging operation of a load circuit according to the first resistance as well as the second resistance.

The present invention also discloses another charging circuit comprising a first current mirror comprising a first branch circuit for generating a first conduction current according to an input voltage, a second branch circuit for generating a second conduction current according to the input voltage, and a third branch circuit for generating a third conduction current according to the input voltage, a second current mirror comprising a fourth branch circuit coupled to the first branch circuit and comprising a first channel width, and a fifth branch circuit coupled to the second branch circuit and comprising a second channel width, wherein a load circuit is coupled between the first current mirror and the second current mirror, and the first current mirror as well as the second current mirror correspondingly adjust values of the first conduction current, the second conduction current and the third conduction current according to the first channel width as well as the second channel width, so as to process a charging operation of the load circuit.

The present invention also discloses another charging circuit comprising a driver circuit for receiving an input voltage to generate an initiation current, a first current mirror comprising a first branch circuit for generating a first conduction current according to the input voltage and the initiation current, a second branch circuit for generating a second conduction current according to the input voltage and the initiation current, and a third branch circuit for generating a third conduction current according to the input voltage and the initiation current, a second current mirror comprising a fourth branch circuit coupled to the first branch circuit and comprising a first channel width, and a fifth branch circuit coupled to the second branch circuit and comprising a second channel width, a third current mirror coupled to the first current mirror and comprising a sixth branch circuit and a seventh branch circuit for receiving the input voltage, a switch transistor coupled to the second branch circuit of the first current mirror and the sixth branch circuit of the third current mirror for determining a conduction condition of the switch transistor according to a switch signal, a first resistor comprising a first resistance, one end coupled to the switch transistor and another end grounded, and a second resistor comprising a second resistance, one end coupled to the seventh branch circuit of the third current mirror and another end grounded, wherein the first current mirror and the second current mirror are utilized to correspondingly adjust values of the first conduction current, the second conduction current and the third conduction current according to the first channel width as well as the second channel width, or the third current mirror is utilized to process the charging operation of the load circuit according to the first resistance as well as the second resistance.

These and other objectives of the present invention will no doubt become obvious to those of ordinary skill in the art after reading the following detailed description of the preferred embodiment that is illustrated in the various figures and drawings.

DETAILED DESCRIPTION

The embodiment of the invention can be applied to different loading circuits with the format/combination as a MOS transistor capacitor, a polysilicon capacitor or a passive circuit. For the simplicity, the MOS transistor capacitor is demonstrated hereinafter, and, particularly, the P-type MOS transistor capacitor is demonstrated for the explanation, which is not limiting the scope of the invention.

Figure 3:
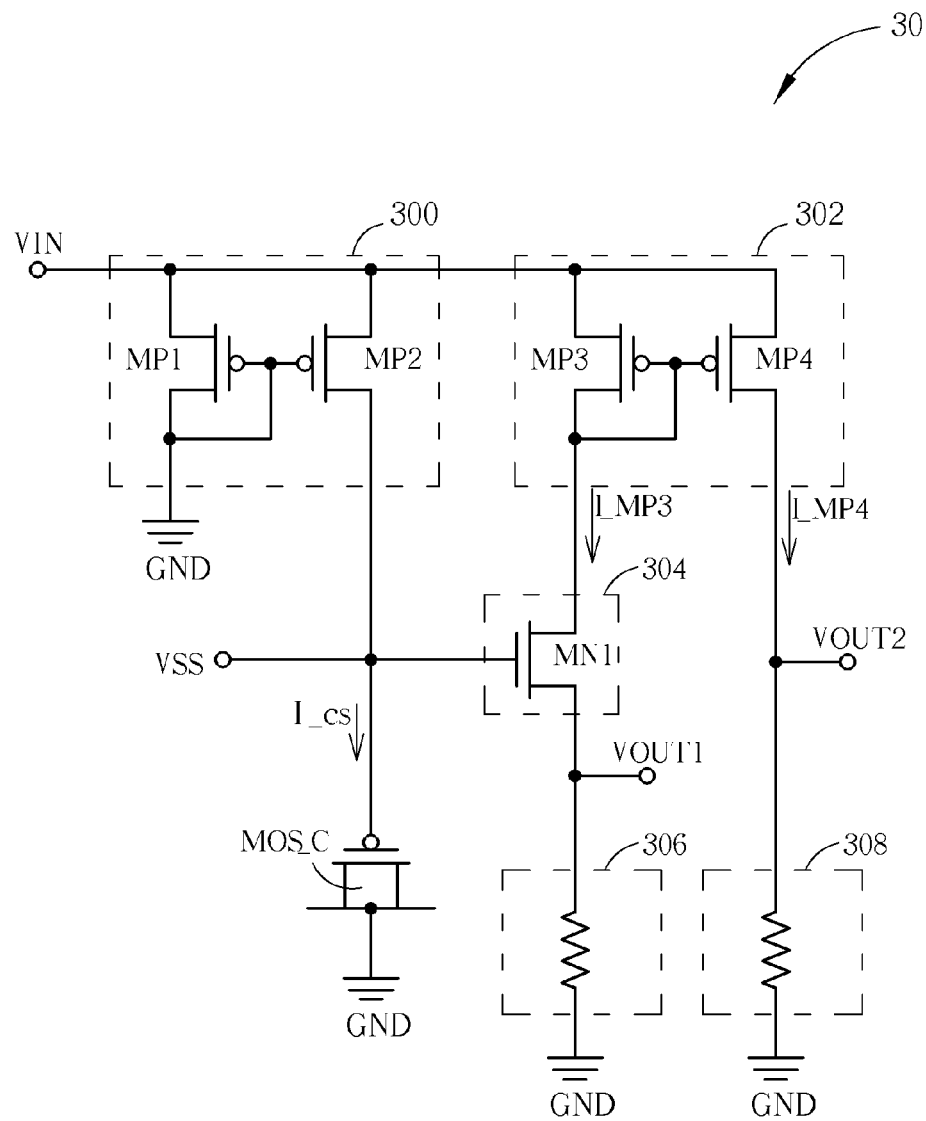
FIG. 3 illustrates a schematic diagram of a charging circuit according to an embodiment of the invention.

Please refer to FIG. 3, which illustrates a schematic diagram of a charging circuit 30 according to an embodiment of the invention. As shown in FIG. 3, the charging circuit 30 includes a first current mirror 300, a second current mirror 302, a switch transistor 304, a first resistor 306 and a second resistor 308. The first current mirror 300 includes P-type MOS transistors MP1, MP2. The second current mirror 302 includes P-type MOS transistors MP3, MP4. Sources of the transistors MP1, MP2, MP3 and MP4 receive an input voltage VIN. The switch transistor 304 is realized as an N-type MOS transistor MN1, and a drain of the transistor MN1 is coupled to a drain of the transistor MP3. A gate of the transistor MN1 is coupled to a drain of the transistor MP2 to receive a switch signal SS. A source of the transistor MN1 is coupled to the first resistor 306. Gates of the transistors MP1, MP2 are coupled to each other and to a drain of the transistor MP1, and gates of the transistors MP3, MP4 are coupled to each other and to a drain of the transistor MN1. A drain of the transistor MP4 is coupled to the second resistor 308.

Similar to the prior art, the drain of the transistor MP2 is coupled to a MOS transistor capacitor MOS_C, and a conduction current I_CS generated by the first current mirror 300 is utilized to perform a charging operation for the MOS transistor capacitor MOS_C. In the embodiment, the switch transistor 304 receives the switch signal SS to correspondingly conduct the transistors MP3, MP4 of the second current mirror 302, so as to generate conduction currents I_MP3, I_MP4. The conduction currents I_MP3, I_MP4 pass the first resistor 306 and the second resistor 308 to be transformed into output voltages VOUT1, VOUT2, which can be utilized to perform the charging operation for another MOS transistor capacitor (not shown in the figure) coupled to the output voltages VOUT1, VOUT2.

Figure 4:
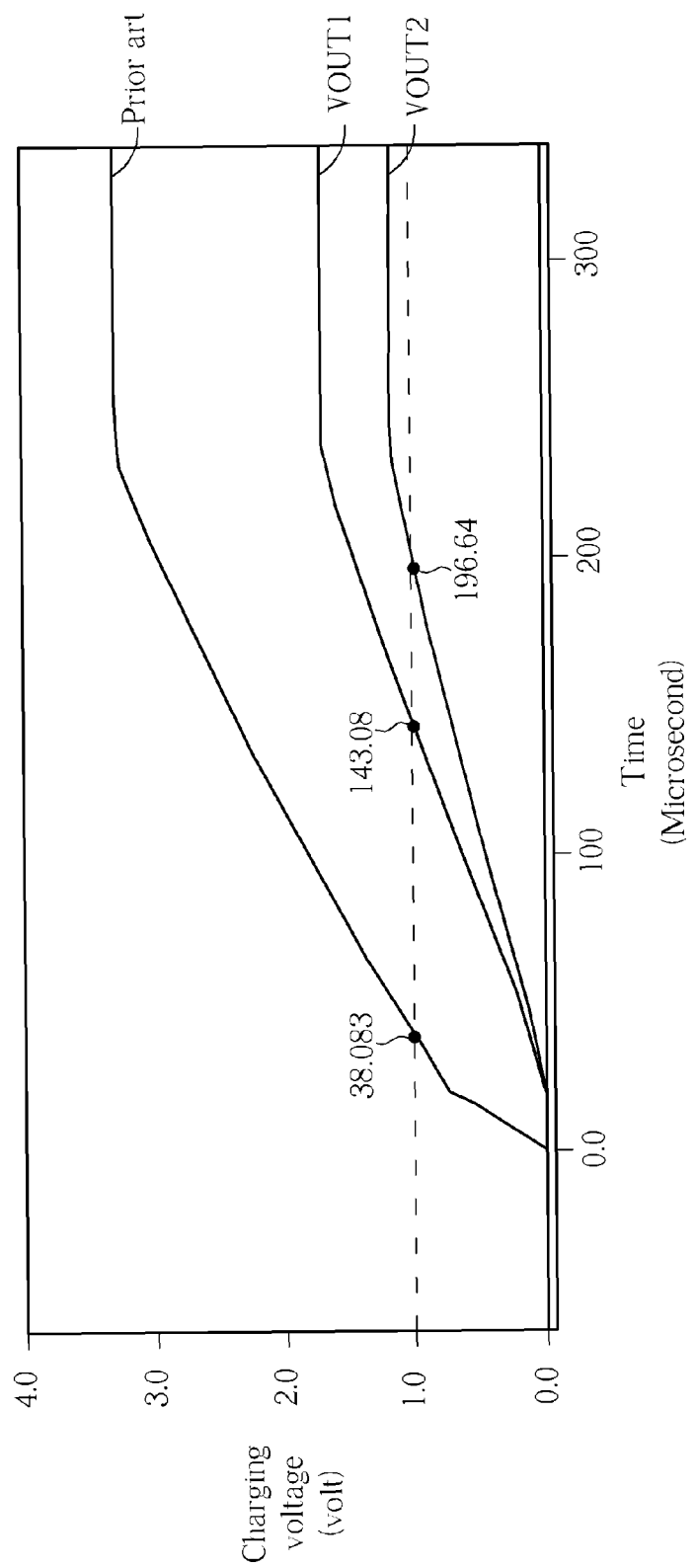
FIG. 4 illustrates a schematic diagram of charging operation comparison between the prior art and the charging circuit according to an embodiment of the invention.

Please refer to FIG. 4, which illustrates a schematic diagram of charging operation comparison between the prior art and the charging circuit 30 according to an embodiment of the invention. As shown in FIG. 4, during the charging operation of the MOS transistor capacitor MOS_C, the physical characteristics of the MOS transistor capacitor MOS_C may result in generation of a turning point nearby a threshold voltage as 0.8 volt of the MOS transistor capacitor MOS_C, so as to correspondingly generate two different charging slopes. However, the charging circuit 30 of the invention utilizes the threshold voltage of 0.8 volt required for conducting the switch transistor 304 to eliminate the turning point in the prior art. Furthermore, adjustment of a resistance ratio formed by the first resistor 306 and the second resistor 308 can be utilized to correspondingly adjust slope changes of the charging slopes related to the output voltages VOUT1, VOUT2, so as to adjust charging periods related to the output voltages VOUT1 and VOUT2, respectively.

Noticeably, the embodiment shown in FIG. 4 has the first resistor 306 with the resistance of 3 ohms and the second resistor 308 with the resistance of 1 ohm. Accordingly, the output voltage VOUT2 has a more gradual charging slope as a liner-charging-voltage operation than the output voltage VOUT1, and users are not necessary to reduce the charging currents or to utilize a larger layout area of the MOS transistor capacitor MOS_C asking for the larger capacitance for the charging operation. For example, to compare three lines shown in FIG. 4 for charging voltage of 1 volt. Sequentially, the prior art is 38.83 microseconds, the output voltage VOUT1 is 143.08 microseconds, and the output voltage VOUT2 is 196.64 microseconds. For different users' requirements, the resistances of the first resistor 306 and the second resistor 308 can be adaptively adjusted to longer the charging period of the charging operation and to approximately maintain the linear charging voltage, so as to meet requirement for the soft start operation, which is also in the scope of the invention.

Figure 5:
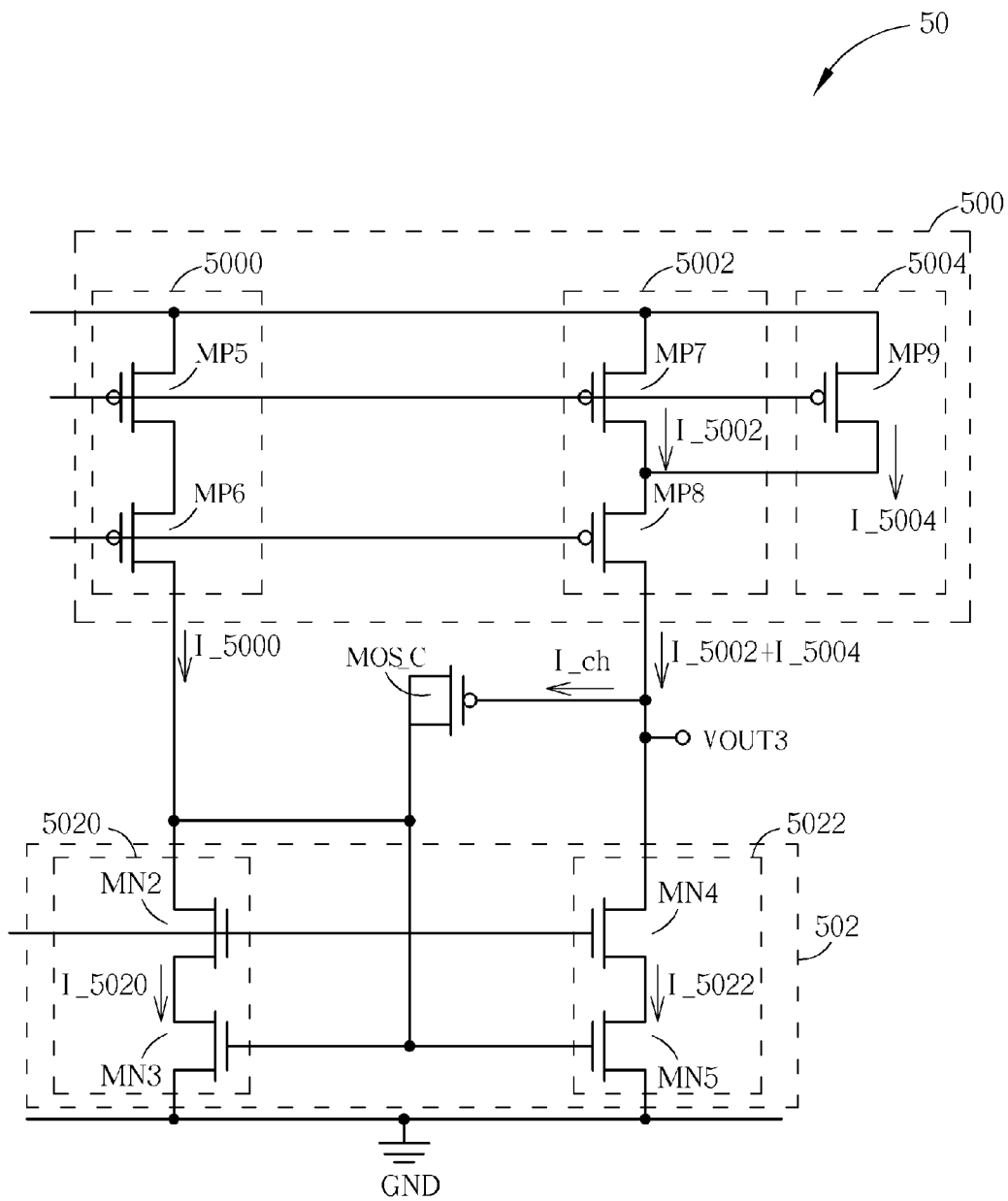
FIG. 5 illustrates a schematic diagram of another charging circuit according to an embodiment of the invention.

Please refer to FIG. 5, which illustrates a schematic diagram of another charging circuit 50 according to an embodiment of the invention. As shown in FIG. 5, the charging circuit 50 includes a first current mirror 500 and a second current mirror 502. For the convenience, the first current mirror 500 is similar to the first current mirror 300 and the second current mirror 302 shown in FIG. 3, including at least a pair of symmetrical transistors having gates coupled to each other. Hereinafter, only partial of the symmetrical structure is depicted for explanation. The first current mirror 500 includes a first branch circuit 5000, a second branch circuit 5002 and a third branch circuit 5004. The first branch circuit 5000 includes P-type MOS transistors MP5, MP6. The second branch circuit 5002 includes P-type MOS transistors MP7, MP8. The third branch circuit 5004 includes a P-type MOS transistor MP9. The second current mirror 502 includes a fourth branch circuit 5020 and a fifth branch circuit 5022. The fourth branch circuit 5020 includes N-type MOS transistors MN2, MN3. The fifth branch circuit 5020 includes N-type MOS transistors MN4, MN5.

Please refer to FIG. 5 again. In the first current mirror 500, the transistors MP5 and MP6 of the first branch circuit 5000 as well as the transistors MP7 and MP8 of the second branch circuit 5002 are realized via cascoded transistors, which means a drain of the transistor MP5 is coupled to a source of the transistor MP6, a drain of the transistor MP7 is coupled to a source of the transistor MP8, and sources of the transistors MP5, MP7 and MP9 receive the input voltage VIN. In the second current mirror 502, the transistors MN2 and MN3 of the fourth branch circuit 5020 as well as the transistors MN4 and MN5 of the fifth branch circuit 5022 are realized via cascoded transistors, which means a source of the transistor MN2 is coupled to a drain of the transistor MN3, a source of the transistor MN4 is coupled to a drain of the transistor MN5, and sources of the transistors MN3 and MN5 are coupled to a ground GND. For connection between the first current mirror 500 and the second current mirror 502, the drain of the transistor MP6 is coupled to the drain of the transistor MN2, and the drain of the transistor MP8 is coupled to the drain of the transistor MN4. Besides, the drain of the transistor MP9 is coupled to the drain of the transistor MP7. The MOS transistor capacitor MOS_C for the charging operation is connected between the first current mirror 500 and the second current mirror 502, wherein one end of the MOS transistor capacitor MOS_C is coupled to the drain of the transistor MP8 and another end is coupled to the drain of the transistor MP6, so as to generate an output voltage VOUT3.

In detail, the user can pre-adjust channel widths of the fourth branch circuit 5020 having the transistors MN2, MN3 and the fifth branch circuit 5022 having the transistor MN4, MN5 of the second current mirror 502, so as to determine a ratio of conduction currents I_5020, I_5022 passing through the fourth branch circuit 5020 and the fifth branch circuit 5022, respectively. Next, the first current mirror 500 utilizes the transistors MP5, MP7 and MP9 to receive the input voltage VIN and to generate conduction currents I_5000, I_5002 and I_5004. Since the transistor MP6 is directly coupled to the transistor MN2 and the transistor MP8 is directly coupled to the transistor MN4, a calculational result of subtracting the conduction current I_5022 from a sum of the conduction currents I_5002 and I_5004 is approximately equivalent to the conduction current I_5004, which causes the conduction current I_5004 must passes the MOS transistor capacitor MOS_C as another conduction path and a charging current I_ch is formed to satisfy Kirchhoff's Current Law, so as to be utilized for the charging operation of the MOS transistor capacitor MOS_C. For example, the conduction current passing through the fourth branch circuit 5020 is 0.5 μA, and the conduction current passing through the fifth branch circuit 5022 is 10 μA, which forms a ratio of 1:20. Under such circumstances, the first branch circuit 5000, the second branch circuit 5002 and the third branch circuit 5004 are designed to have the conduction current as 0.5 μA, 10 μA and 0.5 μA, respectively. Accordingly, the charging current of the MOS transistor capacitor MOS_C is 25 nA, i.e. (10.5−10)/20=25, wherein the number 20 represents a current multiplication belonging to the conduction currents I_5020, I_5022 of the fourth branch circuit 5020 and the fifth branch circuit 5022.

For the pairs of the cascoded transistors MP5 and MP6, MP7 and M8, MN2 and MN3, and MN4 and MN5, they are utilized to stabilize the mentioned conduction currents passing through the transistors thereof, so as to provide a larger input-stage resistance for the input voltage VIN. Certainly, those skilled in the art can modify/replace the cascoded transistor connection to maintain the transistors MP5, MP7, MN2 and MN4 only, so as to form another first branch circuit, second branch circuit, fourth branch circuit and fifth branch circuit, which is also in the scope of the invention.

Noticeably, the first current mirror 500 and the second current mirror 502 are coupled to each from top to bottom and the MOS transistor capacitor MOS_C is in parallel connected between the first current mirror 500 and the second current mirror 502. Therefore, different branch circuits, which are related to the first current mirror 500 and the second current mirror 502, coupled to each other must share the same conduction currents. Under such circumstances, another asymmetrical branch circuit, i.e. the transistor MP9 in the embodiment of the invention, can be correspondingly disposed to provide extra conduction current, i.e. the conduction current I_5004 in the embodiment of the invention. Or the transistor MP7 of the second branch circuit 5002 and the transistor MP9 of the third branch circuit 5004 can be integrated together to have larger conduction width, so as to directly generate another conduction current as a sum of the conduction current I_5004 and the conduction current I_5002 to be outputted via the second branch circuit 5002 for processing the charging operation of the MOC transistor capacitor MOS_C. Certainly, those skilled in the art can combine other generation of stable current source with symmetrical/asymmetrical branch circuits of the current mirrors based on the same conception of the invention as well as Kirchhoff's Current Law, so as to perform the charging operation of the MOS transistor capacitor MOS_C. Similarly, combination of a plurality of current mirrors, a plurality of branch circuits and the charging circuit 50 can be utilized to process the charging operation as well, which is also in the scope of the invention.

Figure 6:
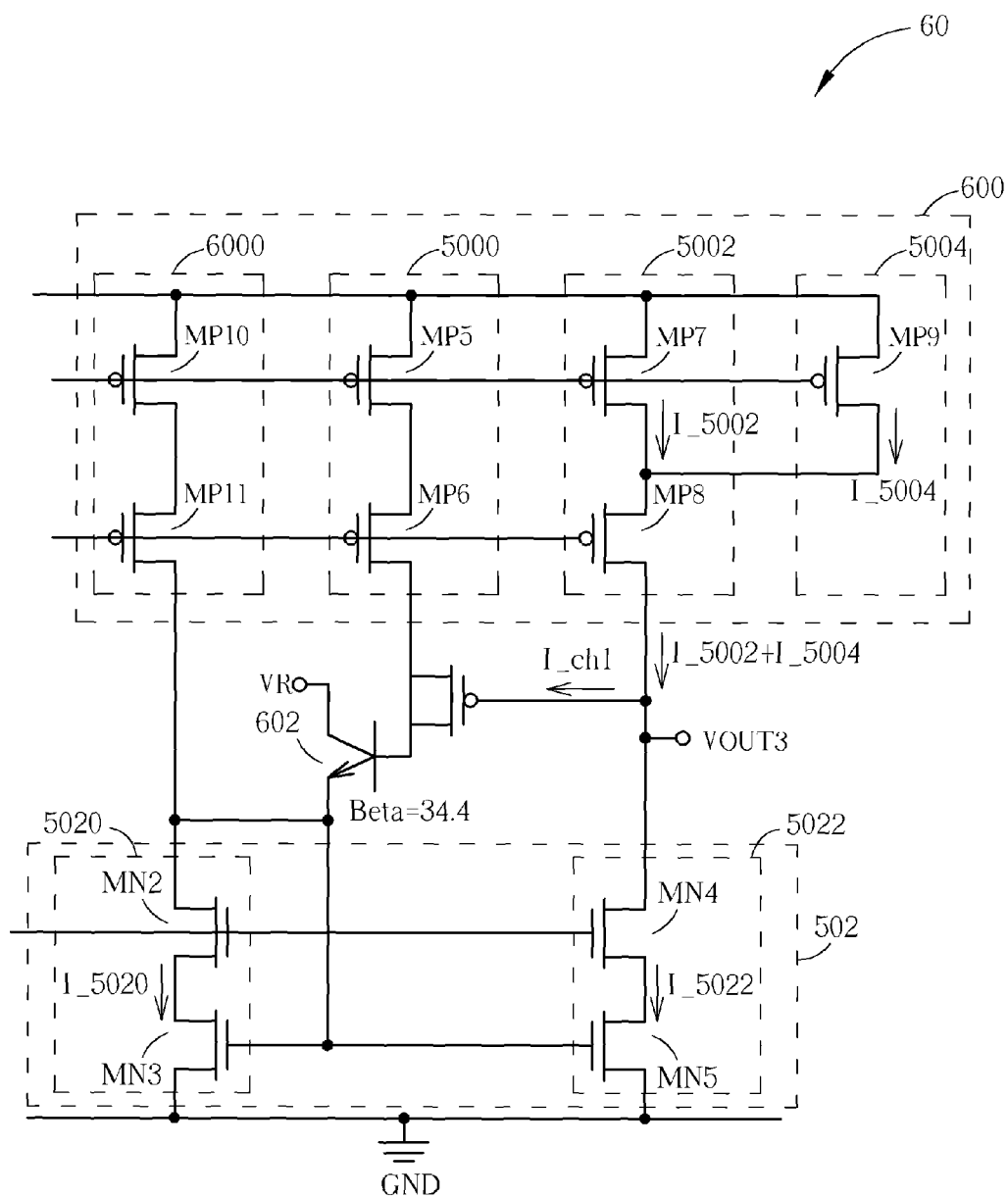
FIG. 6 illustrates a schematic diagram of another charging circuit according to an embodiment of the invention.

Please refer to FIG. 6, which illustrates a schematic diagram of another charging circuit 60 according to an embodiment of the invention. As shown in FIG. 6, the charging circuit 60 is similar to the charging circuit 50 shown in FIG. 5, and the only difference is that a sixth branch circuit 6000 is additionally disposed to the first current mirror 500 to be another first current mirror 600. In other words, the first current mirror 600 includes the first branch circuit 5000 having the P-type MOS transistors MP5, MP6, the second branch circuit 5002 having the P-type MOS transistors MP7, MP8, the third branch circuit 5004 having the P-type MOS transistor MP9 and the sixth branch circuit 6000 having P-type MOS transistors MP10, MP11. Besides, the charging circuit 60 additionally disposes a bipolar junction transistor (BJT) 602 with a gain parameter Beta of 34.4. A collector of the BJT 602 is coupled to a reference voltage source VR, a base of the BJT 602 is coupled to one end of the MOS transistor capacitor MOS_C and the drain of the transistor MP6, and an emitter of the BJT 602 is coupled to the drains of the transistor MP11 and MN2. Under such circumstances, the transistor MP6 of the first branch circuit 5000 and the transistor MP11 of the sixth branch circuit 6000 are simultaneously coupled to the transistor MN2 of the fourth branch circuit 5020. Connection of the other elements is similar to the charging circuit 50 shown in FIG. 5, and is not described hereinafter. The gain parameter Beta as 34.4 of the BJT 602 is demonstrated as an example, and those skilled in the art can adaptively modify/adjust values of the gain parameter Beta to fit different users' requirements.

In detail, while the charging circuit 60 just initiates, the first branch circuit 5000 and the sixth branch circuit 6000 provide the conduction currents. Next, the first branch circuit 5000 and the sixth branch circuit 6000 are turned off until the BJT 602 initiates. The BJT 602 is independently operated to reduce the calculational result (i.e. the conduction current I_5004) of the charging circuit 50 via the gain parameter Beta. For current multiplication of the gain parameter Beta, the charging current of the MOS transistor capacitor MOS_C can be effectively reduced. For example, the conduction current of the fourth branch circuit 5020 is 3.5 µA and the conduction current of the fifth branch circuit 5022 is 35 µA, which has a ratio of 1:10. Under such circumstances, the sixth branch circuit 6000, the first branch circuit 5000, the second branch circuit 5002 and the third branch circuit 5004 are designed to have the conduction currents as 0.1 µA, 0.1 µA, 35 µA and 0.4 µA, respectively, such that the charging current I_ch1 passing through the MOS transistor capacitor MOS_C is 11 nA, i.e. (35.4-35)/34.4=11. Therefore, the charging circuit 60 provides another charging current I_ch1 having smaller current value to process the charging operation of the MOS transistor capacitor MOS_C, which can avoid the conventional drawback of leakage current interference or utilization of the larger layout area of the MOS transistor capacitor MOS_C, so as to provide the soft start operation of the MOS transistor capacitor MOS_C.

Figure 7:
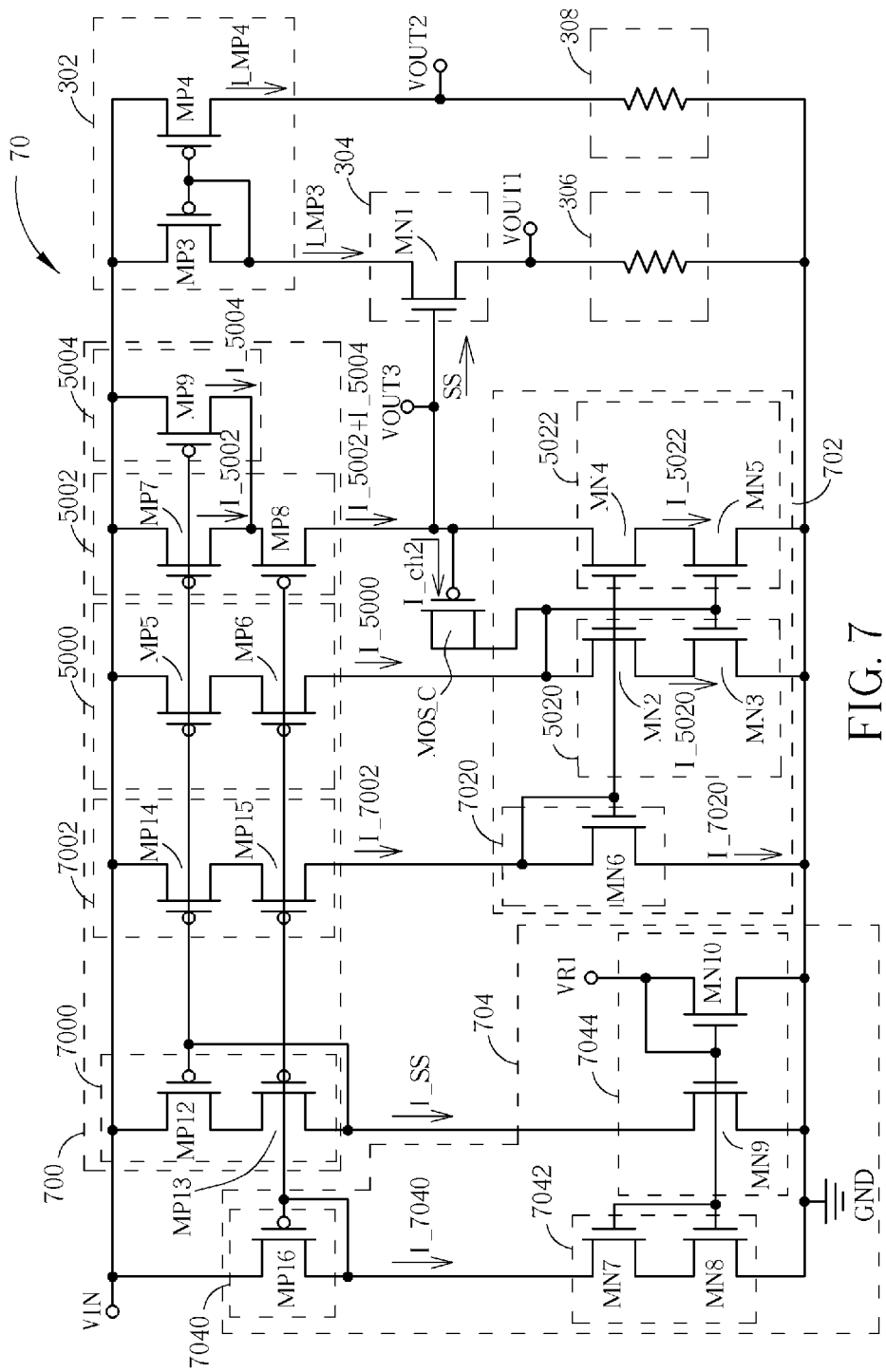
FIG. 7 illustrates a schematic diagram of another charging circuit according to an embodiment of the invention.

Please refer to FIG. 7, which illustrates a schematic diagram of another charging circuit 70 according to an embodiment of the invention. As shown in FIG. 7, the charging circuit 70 further combines the above embodiments including the charging circuit 30 and charging circuit 50, and only partial circuit composition/connection has to be adjusted to realize the charging operation of the MOS transistor capacitor MOS_C. The charging circuit 70 includes the second current mirror 302 of the charging circuit 30 having two P-type MOS transistors MP3, MP4, the switch transistor 304 having the N-type MOS transistor MN1, the first resistor 306 and the second resistor 308. Also, the charging circuit 70 includes the first branch circuit 5000 having the P-type MOS transistors MP5, MP6, the second branch circuit 5002 having the P-type MOS transistors MP7, MP8, the third branch circuit 5004 having the P-type MOS transistor MP9, the fourth branch circuit 5020 having the N-type MOS transistors MN2, MN3, and the fifth branch circuit 5022 having the N-type MOS transistors MN4, MN5 of the charging circuit 50. Further, the charging circuit 70 combines the first branch circuit 5000, the second branch circuit 5002 and the third branch circuit 5004 as a sixth branch circuit 7000 having P-type MOS transistors MP12, MP13 and a seventh branch circuit 7002 having P-type MOS transistors MP14, MP15. The sixth branch circuit 7000 as well as the seventh branch circuit 7002 are regarded as another first current mirror 700. The fourth branch circuit 5020, the fifth branch circuit 5022 and an N-type MOS transistor MN6 are regarded as another second current mirror 702, and accordingly, a driver circuit 704 is additionally disposed. The driver circuit 704 includes a switch transistor 7040 having a P-type MOS transistor MP16, a cascoded transistor 7042 having N-type MOS transistors MN7, MN8, and a fourth current mirror 7044 having N-type MOS transistors MN9, MN10. The transistor MP16 includes a source for receiving the input voltage VIN, a gate coupled to the gate of the transistor MP13, and a drain coupled to the drain of the transistor MN7. The transistor MN7 includes a source coupled to a drain of the transistor MN8, and a gate coupled to gates of the transistors MN8, MN9. The transistor MN9 includes a drain coupled to a drain of the transistor MP13, and a gate of the transistor MN10 and a drain of the transistor MN10 are coupled to the gate of the transistor MN9. Sources of the transistor MN8, MN9 and MN10 are coupled to the ground GND, and a drain of the transistor MN10 is coupled to the reference voltage source VR1.

In detail, the transistor MN10 receives the reference voltage source VR1 and generates the start current I_SS via copying of the transistor MN9. In the meanwhile, the transistor MP16 receives the input voltage VIN to conduct the cascoded transistor 7042 to correspondingly generate a conduction current I_7040. Thus, the transistors MP13, MP15, MP6 and MP8 of the first current mirror 700 are provided with a start bias, so as to drive the first current mirror 700 and the second current mirror 702. The sixth branch circuit 7000 provides conduction currents I_7002, I_5000, I_5002 and I_5004 to the seventh branch circuit 7002, the first branch circuit 5000, the second branch circuit 5002 and the third branch circuit 5004, respectively. According to the conduction current I_7002, the seventh branch circuit 7002 generates a conduction current I_7020 to be provided to the transistors MN2, MN4 as the start bias, so as to generate conduction currents I_5020, I_5022 of the fourth branch circuit 5020 and the fifth branch circuit 5022. As to the charging operation of the first current mirror 700 and the second current mirror 702, detailed descriptions can be referenced in related paragraphs of the charging circuit 50 and FIG. 5, which leads to a calculational result (i.e. a conduction current I_5004=25 nA) via the plurality of conduction currents to have another charging current I_ch2 for the charging operation of the MOS transistor capacitor MOS_C. Accordingly, an output voltage VOUT3 is generated.

Furthermore, the output voltage VOUT3 is regarded as the switch signal SS to control conduction conditions of the switch transistor 304. The transistors MP3, MP4 are correspondingly conducted via the conduction conditions of the switch transistor 304 to generate conduction currents I_MP3, I_MP4. Lastly, the first resistor 306 and the second resistor 308 transform the conduction currents I_MP3, I_MP4 into the output voltages VOU1, VOUT2. The charging operation with the adjustable charging period as well as the charging slope are provided to process the charging operation of another MOS transistor capacitor (not shown in the figure) coupled to the output voltage VOUT1 or to the output voltage VOUT2. The above description can also be referenced in the related paragraphs of the charging circuit 30, FIG. 3 and FIG. 4, and is not described hereinafter.

Figure 8:
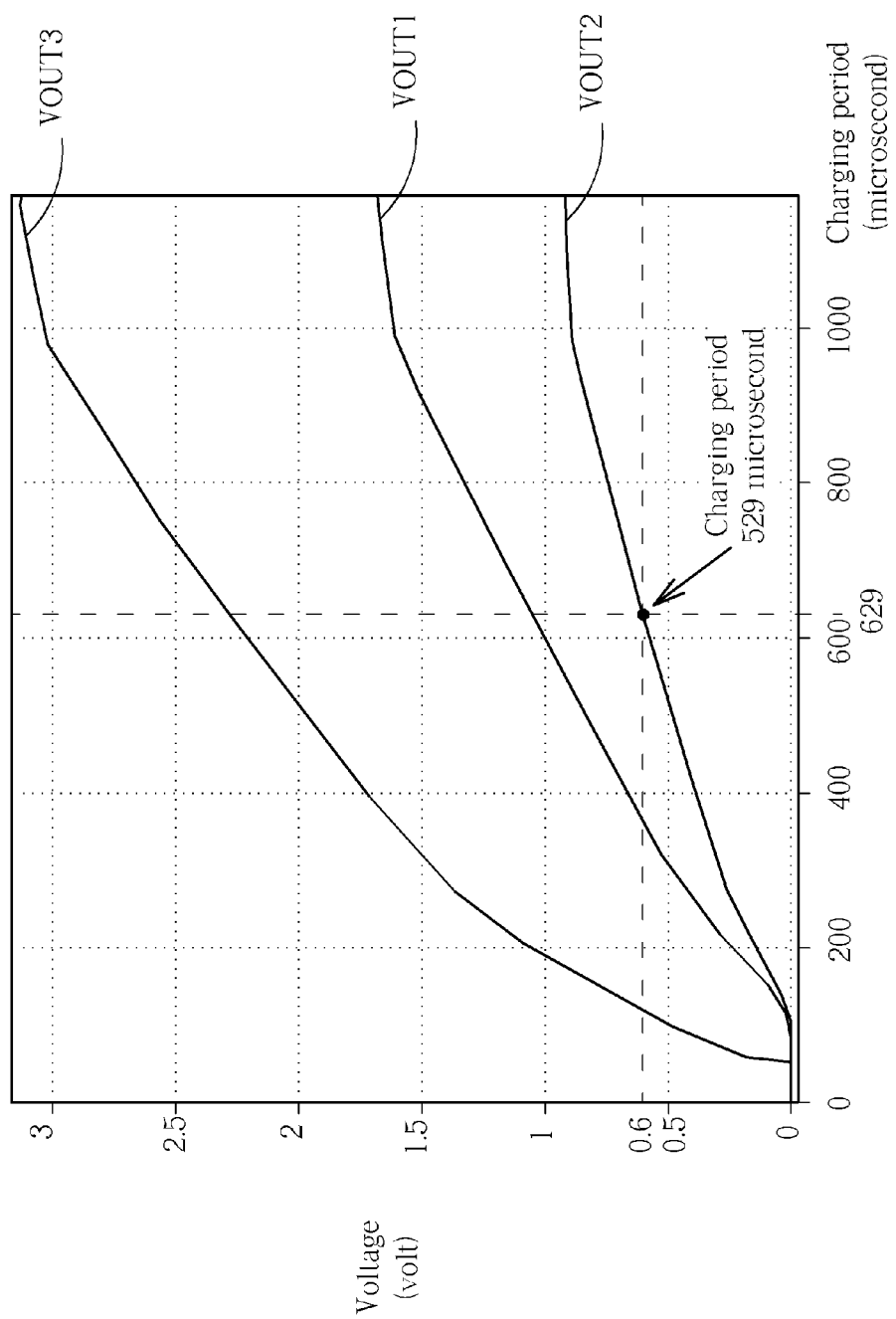
FIG. 8 illustrates a schematic comparison diagram of the charging circuit shown in FIG. 7 to provide different output voltages according to an embodiment of the invention.

In simple, the charging circuit 70 can adjust the charging slope as well as the charging period to have a more gradual charging slope as the linear-charging-voltage operation and to satisfy the soft start operation. Also, the asymmetrical branch circuit (i.e. the transistor MP9) can be utilized to provide the extra conduction current (i.e. conduction current I_5004) as the charging current I_ch2, so as to perform the charging operation of the MOS transistor capacitor MOS_C. Please refer to FIG. 8, which illustrates a schematic comparison diagram of the charging circuit 70 shown in FIG. 7 to provide different output voltages according to an embodiment of the invention. As shown in FIG. 8, the output voltages VOUT1, VOUT2 and VOUT3 correspond to different charging lines, and the user can adaptively modify/adjust the channel widths or the resistances related to different branch circuits to satisfy different requirements, so as to adjust the slope changes of the charging lines and to provide a variety of selections of the soft start operation. For example, the embodiment of the invention utilizes the charging current of 25 nA to process the charging operation of the MOS transistor capacitor MOS_C having an effective capacitance as 10 picofarads (pF). From beginning of the charging operation to the solid line shown in the figure, the output voltage VOUT2 is increased to 0.6 volts and the charging period of the soft start operation is 529 microseconds.

Figure 9:
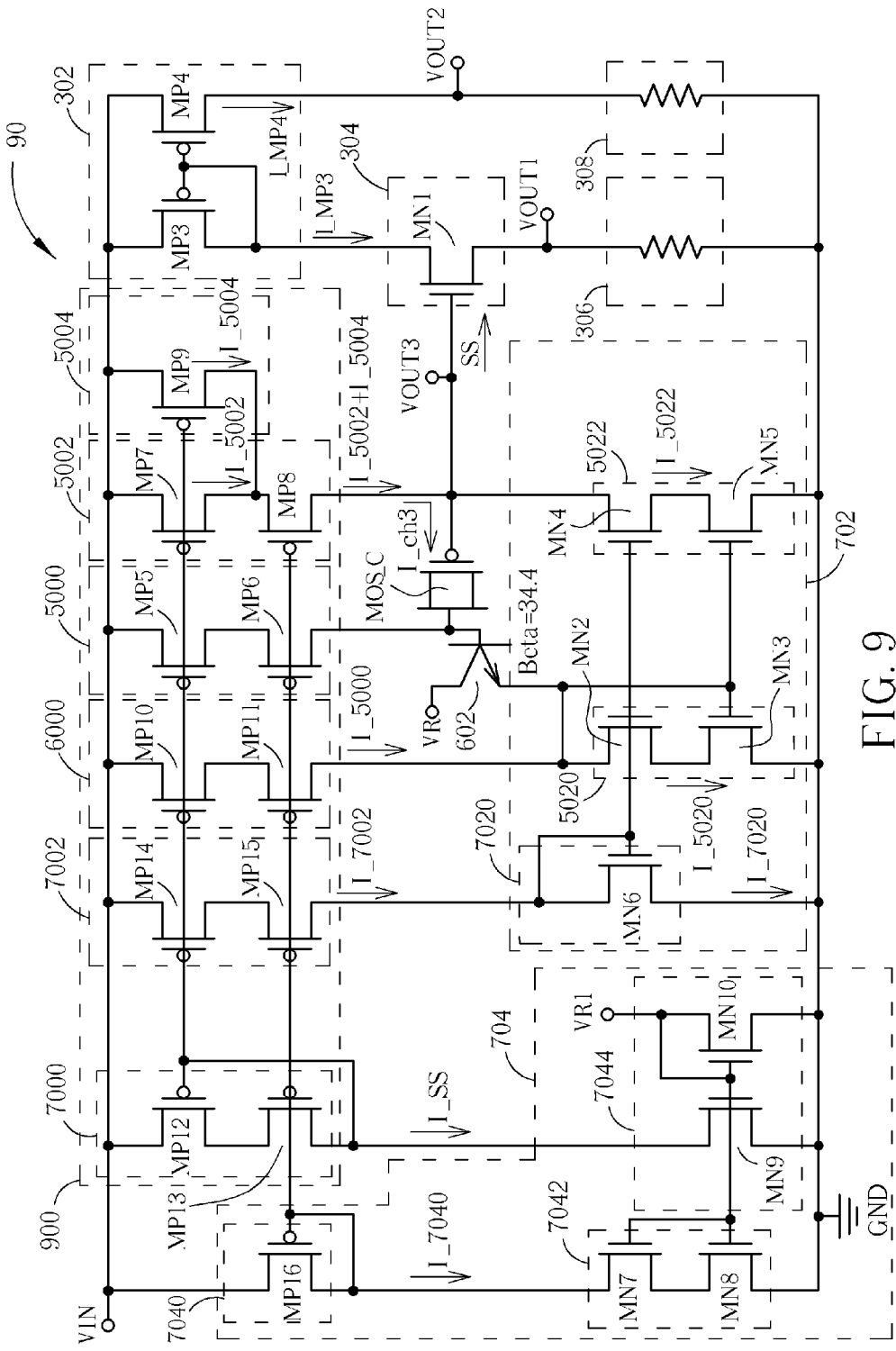
FIG. 9 illustrates a schematic diagram of another charging circuit according to an embodiment of the invention.

Please refer to FIG. 9, which illustrates a schematic diagram of another charging circuit 90 according to an embodiment of the invention. As shown in FIG. 9, the charging circuit 90 combines the above embodiments including the charging circuit 30 and the charging circuit 60, and has a similar structure to the charging circuit 70. The only difference is that the first current mirror 700 further includes the sixth branch circuit 6000 to form another first current mirror 900. Connection/composition of other elements can be referenced to the charging circuit 30, the charging circuit 60 and the charging circuit 70, which is not described hereinafter. In comparison with the charging circuit 70, the charging circuit 90 further utilizes the gain parameter Beta of the BJT 602 to reduce values of the calculational result (i.e. the conduction current I_5004=12 nA) to be the charging current I_ch3. The charging current I_ch3 passing through the MOS transistor capacitor MOS_C is reduced to avoid the conventional drawback of leakage current interference or utilization of the larger layout area of the MOS transistor capacitor MOS_C, so as to provide the soft start operation of the MOS transistor capacitor MOS_C.

Figure 10:
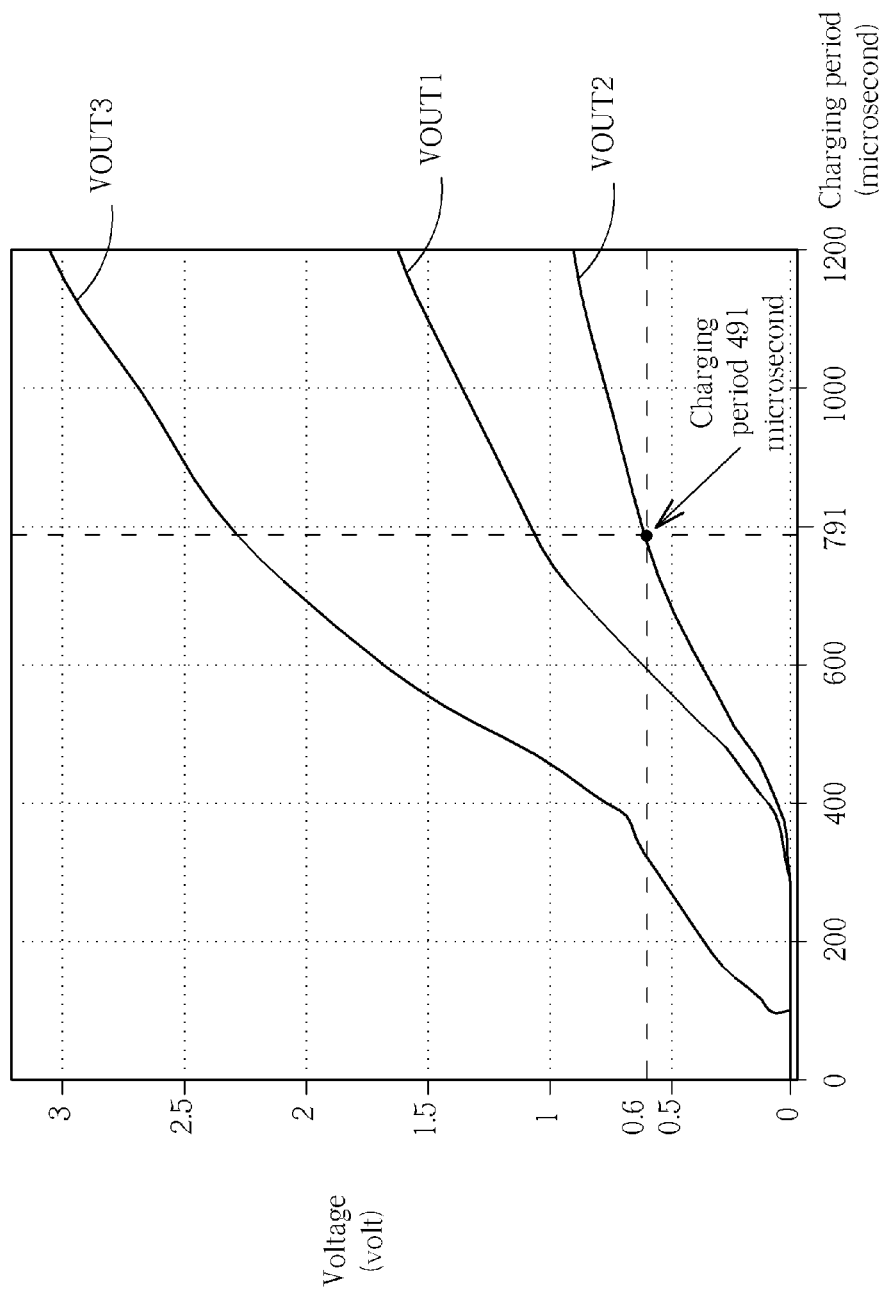
FIG. 10 illustrates a schematic comparison diagram of the charging circuit shown in FIG. 9 to provide different output voltages according to an embodiment of the invention.

Please refer to FIG. 10, which illustrates a schematic comparison diagram of the charging circuit 90 shown in FIG. 9 to provide different output voltages according to an embodiment of the invention. As shown in FIG. 10, the output voltages VOUT1, VOUT2 and VOUT3 correspond to different charging lines, and the user can adaptively modify/adjust the channel widths or the resistances related to different branch circuits to satisfy different requirements, so as to adjust slope changes of the charging lines and to provide a variety of selections of the soft start operation. For example, the embodiment of the invention utilizes the charging current of 12 nA to process the charging operation of the MOS transistor capacitor MOS_C having an effective capacitance as 6 pF. From beginning of the charging operation to the solid line shown in the figure, the output voltage VOUT2 is increased to 0.6 volts and the charging period of the soft start operation is 491 microseconds.

Figure 11:
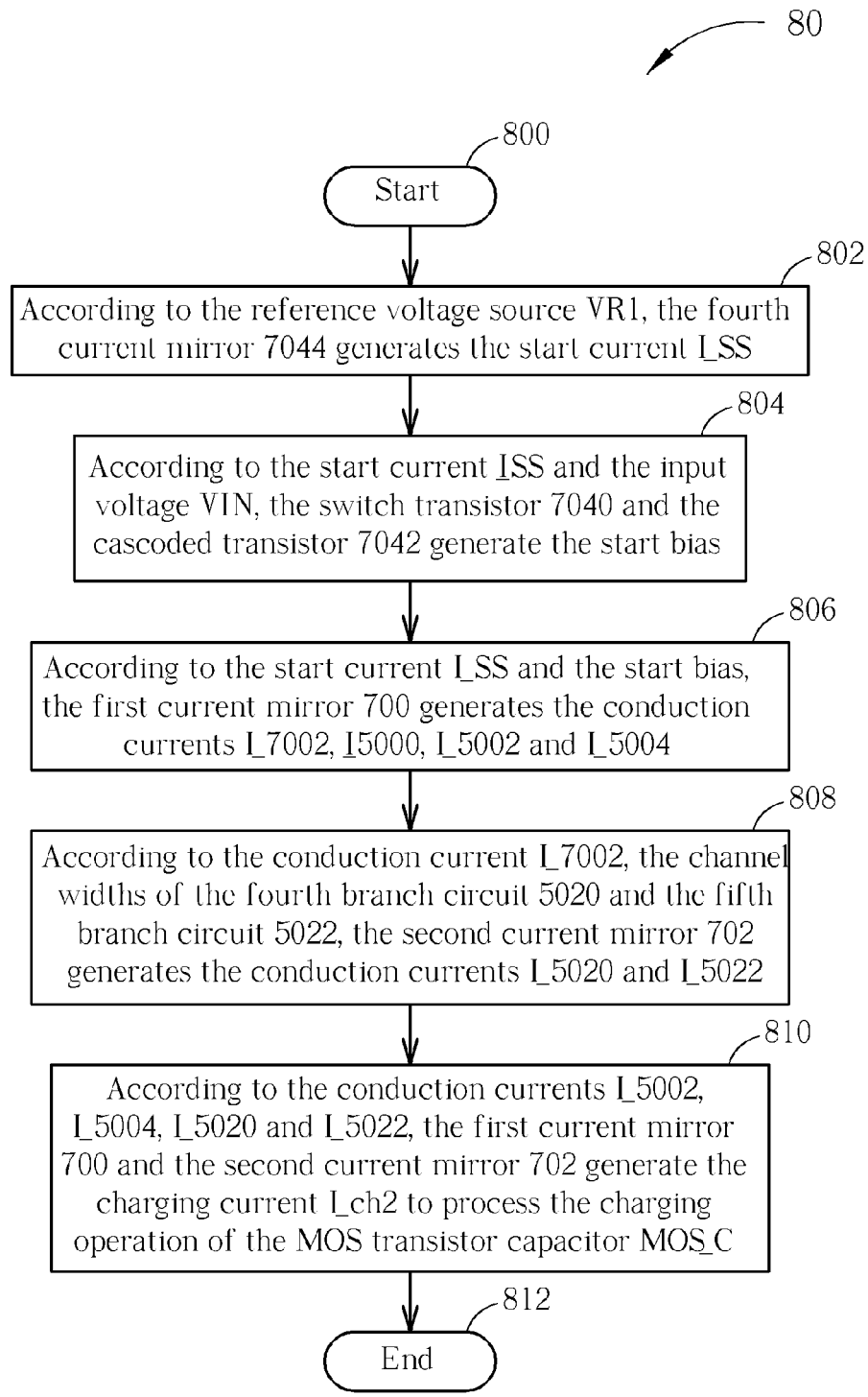
FIG. 11 illustrates a flow chart of a charging process according to an embodiment of the invention.

Further, the charging operation of the charging circuit 70 can be summarized as a charging process 80, as shown in FIG. 11. The charging process 80 includes the steps as follows:

Step 800: Start.

Step 802: According to the reference voltage source VR1, the fourth current mirror 7044 generates the start current I_SS.

Step 804: According to the start current I_SS and the input voltage VIN, the switch transistor 7040 and the cascoded transistor 7042 generate the start bias.

Step 806: According to the start current I_SS and the start bias, the first current mirror 700 generates the conduction currents I_7002, I_5000, I_5002 and I_5004.

Step 808: According to the conduction current I_7002, the channel widths of the fourth branch circuit 5020 and the fifth branch circuit 5022, the second current mirror 702 generates the conduction currents I_5020 and I_5022.

Step 810: According to the conduction currents I_5002, I_5004, I_5020 and I_5022, the first current mirror 700 and the second current mirror 702 generate the charging current I_ch2 to process the charging operation of the MOS transistor capacitor MOS_C.

Step 812: End.

Figure 12:
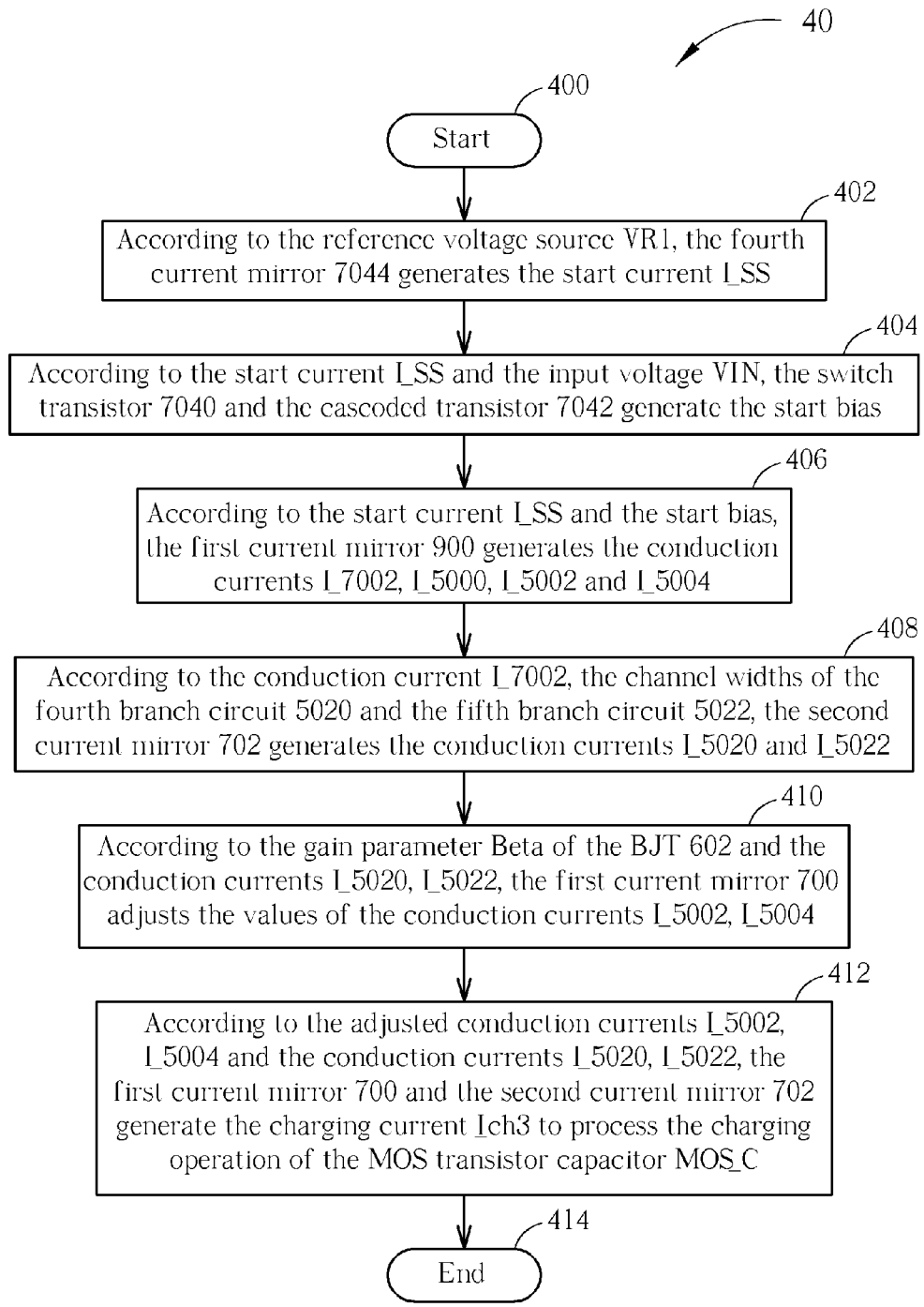
FIG. 12 illustrates a flow chart of another charging process according to an embodiment of the invention.

Further, the charging operation of the charging circuit 90 can be summarized as another charging process 40, as shown in FIG. 12. The charging process 40 includes the steps as follows:

Step 400: Start.

Step 402: According to the reference voltage source VR1, the fourth current mirror 7044 generates the start current I_SS.

Step 404: According to the start current I_SS and the input voltage VIN, the switch transistor 7040 and the cascoded transistor 7042 generate the start bias.

Step 406: According to the start current I_SS and the start bias, the first current mirror 900 generates the conduction currents I_7002, I_5000, I_5002 and I_5004.

Step 408: According to the conduction current I_7002, the channel widths of the fourth branch circuit 5020 and the fifth branch circuit 5022, the second current mirror 702 generates the conduction currents I_5020 and I_5022.

Step 410: According to the gain parameter Beta of the BJT 602 and the conduction currents I_5020, I_5022, the first current mirror 700 adjusts the values of the conduction currents I_5002, I_5004.

Step 412: According to the adjusted conduction currents I_5002, I_5004 and the conduction currents I_5020, I_5022, the first current mirror 700 and the second current mirror 702 generate the charging current I_ch3 to process the charging operation of the MOS transistor capacitor MOS_C.

Step 414: End.

Figure 13:
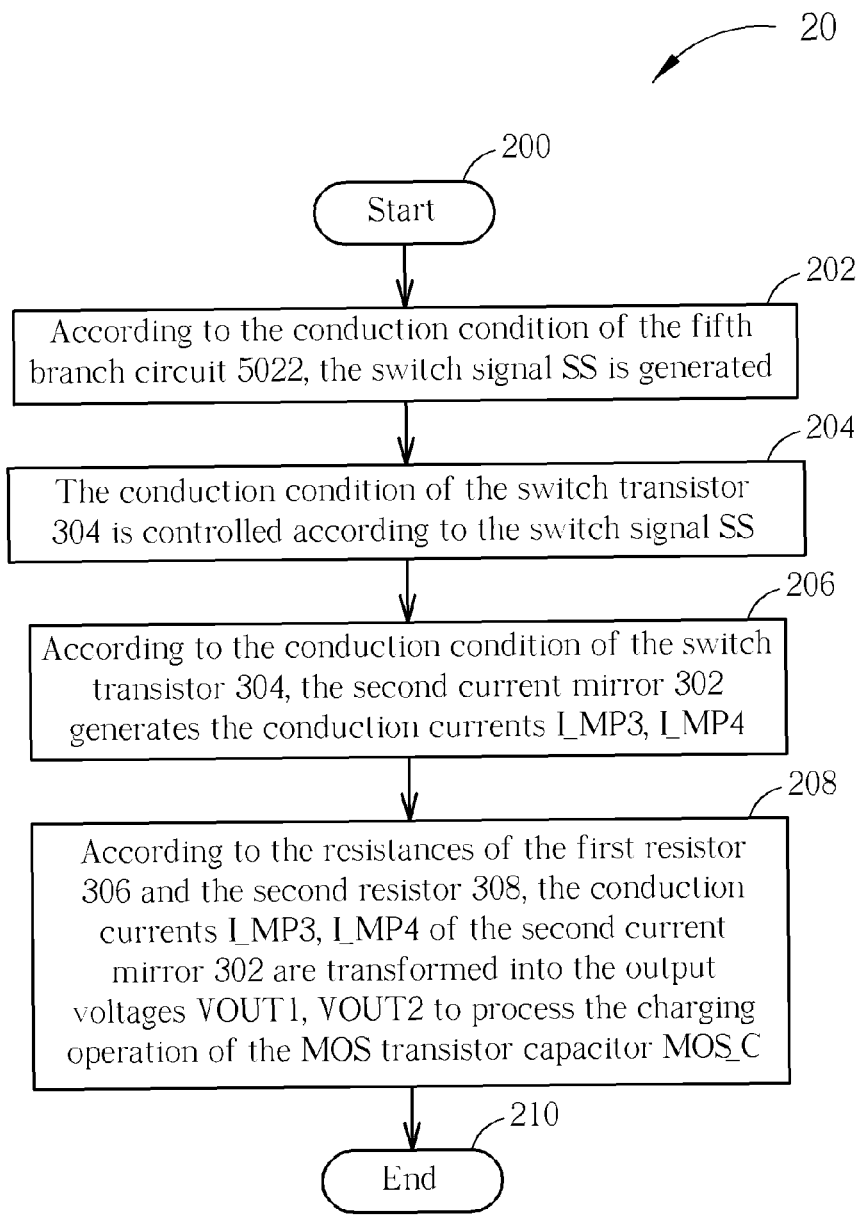
FIG. 13 illustrates a flow chart of another charging process according to an embodiment of the invention.

Further, the charging operation of the charging circuit 30 can be summarized as another charging process 20 to be added after Step 810 and Step 412, as shown in FIG. 13. The charging process 20 includes the steps as follows:

Step 200: Start.

Step 202: According to the conduction condition of the fifth branch circuit 5022, the switch signal SS is generated.

Step 204: The conduction condition of the switch transistor 304 is controlled according to the switch signal SS.

Step 206: According to the conduction condition of the switch transistor 304, the second current mirror 302 generates the conduction currents I_MP3, I_MP4.

Step 208: According to the resistances of the first resistor 306 and the second resistor 308, the conduction currents I_MP3, I_MP4 of the second current mirror 302 are transformed into the output voltages VOUT1, VOUT2 to process the charging operation of the MOS transistor capacitor MOS_C.

Step 210: End

The detailed steps of the charging process 80, 40 and 20 can be understood via the related paragraphs of the charging circuit 30, 70 and 90 and FIG. 3, FIG. 7 and FIG. 9, and are not described hereinafter. Thus, those skilled in the art can arbitrarily combine the charging process 20 after operations of Step 810 and Step 412, or the charging processes 40 and 80 can be independently operated. Certainly, the charging process 20 can be independently operated as well, which can be realized with combination of a stable current source, like the first current mirror 300, and the switch signal to transform the conduction currents I_MP3, I_MP4 into the output voltages VOUT1, VOUT2, which is not limiting the scope of the invention.

Figure 1A:
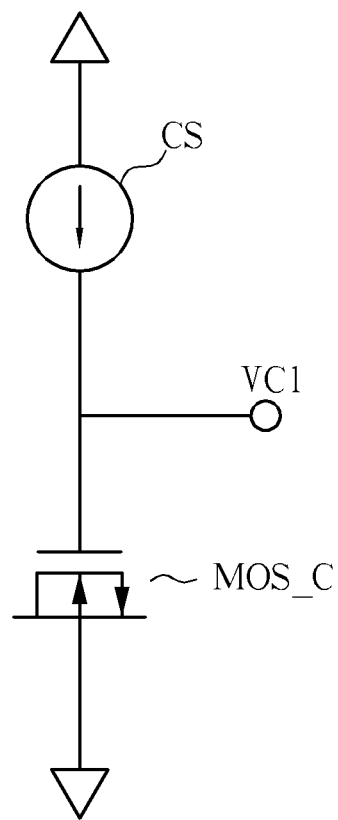
FIG. 1A illustrates a schematic diagram of a conventional MOS transistor capacitor for a charging operation.
Figure 1B:
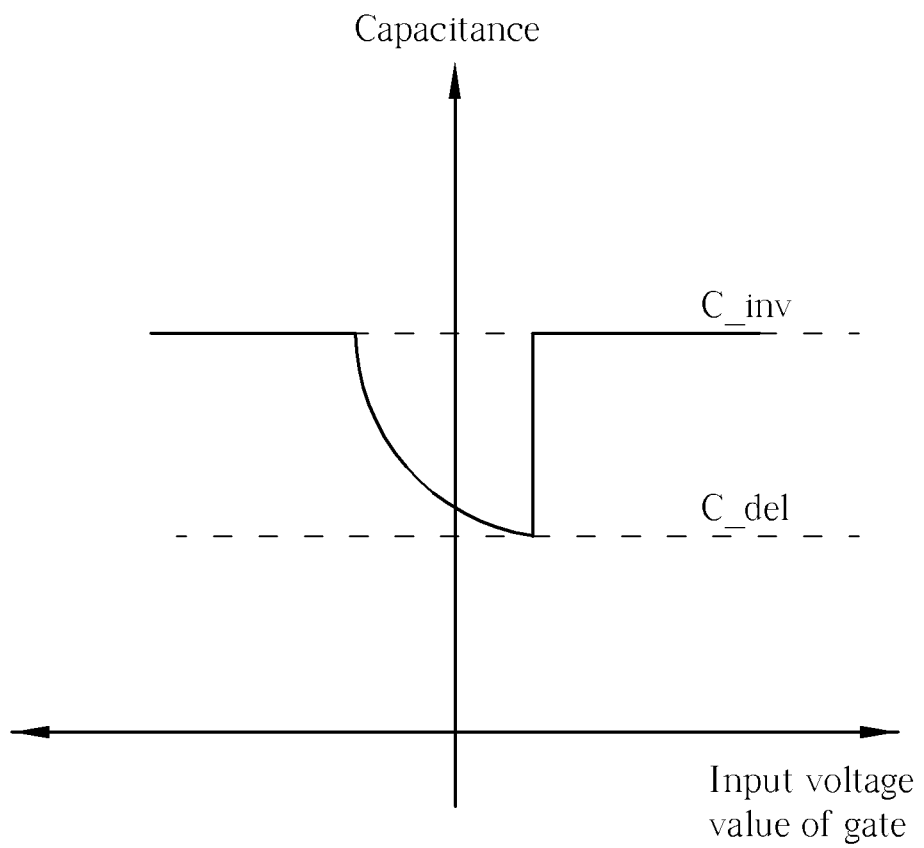
FIG. 1B illustrates a schematic diagram of different operational conditions of the MOS transistor capacitor versus different capacitances.
Figure 2:
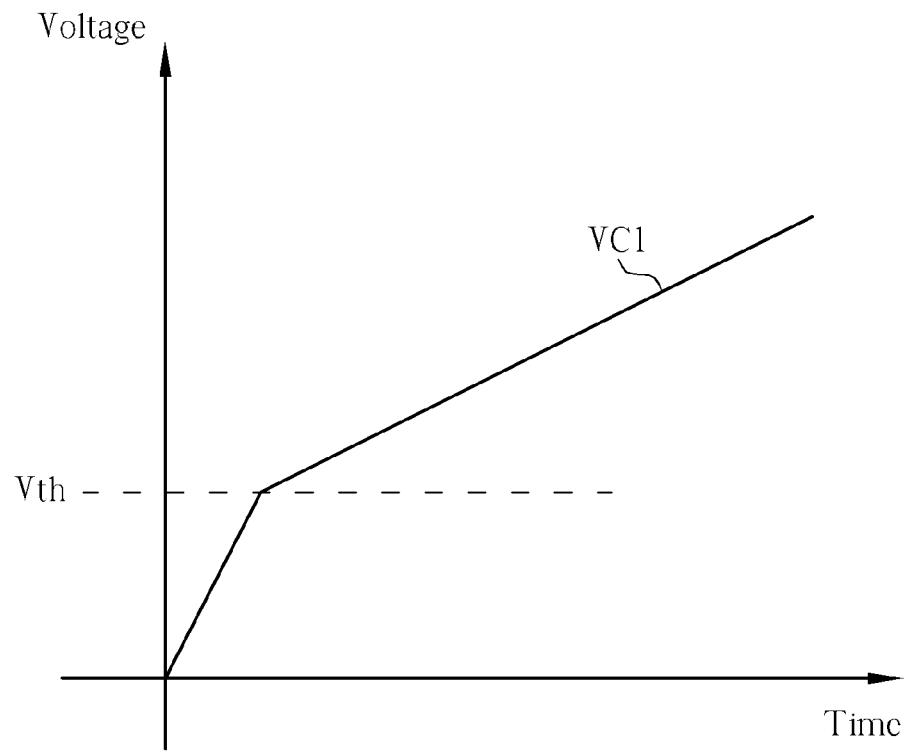
FIG. 2 illustrates a schematic diagram of a terminal voltage of the MOS capacitor at different timings.

Furthermore, as shown in the table as below, the prior art utilizes the stable current source CS, as shown in FIG. 1A, to process the charging operation of the MOS transistor capacitor MOS_C, which leads to the problems with weakness of minor current against noises as well as to have larger effective capacitances. In comparison, the charging circuit 70 or 90 of the invention utilizes the current difference as the minor current against noises/interferences and provides a smaller effective capacitance corresponding to a smaller layout area. Also, the charging period of the invention is approximately equivalent to the prior art to broaden product application of the charging circuit 70 or 90.

| Charging process | Charging current (nA) | Charging capacitance (pF) | Charging voltage (v) | Charging period (μs) |
|---|---|---|---|---|
| Prior art | 50 | 75 | 0.6 | 536 |
| Charging circuit 70 | 25 | 10 | 0.6 | 529 |
| Charging circuit 90 | 12 | 6 | 0.6 | 491 |

Noticeably, the embodiments of the invention are only depicted with representative transistor structures. Such as the charging circuit 50 shown in FIG. 5, the first current mirror 500 is realized via P-type MOS transistors, and the second current mirror 502 is correspondingly realized via N-type MOS transistors to output different increasing output voltages. Certainly, those skilled in the art can realize the first current mirror 500 with the N-type MOS transistors, and realize the second current mirror 502 with the P-type MOS transistors, so as to output different decreasing output voltages. Certainly, replacement can be applied to the charging circuit 30, 60, 70 or 90, and combination having the P-type MOS transistors mixing the N-type MOS transistors can be anticipated as well. Besides, the invention utilizes the P-type MOS transistor capacitor to explain related realization, and those skilled in the art can adaptively modify/change/adjust the charging circuit 30, 50, 60, 70, 90 to be applied to the polysilicon capacitor, the passive circuit or combination thereof, so as to provide the charging operation with the adjustable charging period and the adjustable charging slope and to provide the soft start operation as well, which is also in the scope of the invention. Additionally, the P-type MOS transistor or the N-type MOS transistor utilized in the invention has avoided occurrence of the body effect, and it is not necessary to limit the pin positions onto the bulk/body.

In summary, the invention provides a plurality of embodiments as a charging circuit. In the first embodiment, a switch signal controls a switch transistor to correspondingly conduct a current mirror generating a plurality of conduction currents. Then the plurality of conduction currents passing through different resistors are transformed into output voltages to process a charging operation of the MOS transistor capacitor. In the second embodiment, at least two current mirrors are coupled together, wherein one of the current mirrors has an asymmetrical branch circuit to provide extra conduction current for the charging operation of the MOS transistor capacitor. In the third embodiment, combination of the first embodiment as well as the second embodiment is achieved to simultaneously perform the charging operation of the MOS transistor capacitor. IN the fourth embodiment, amendment of the second embodiment is derived to further include another bipolar junction transistor, and the bipolar junction transistor provides current multiplication to be combined with the first embodiment for charging operation of the MOS transistor capacitor. Under such circumstances, the above embodiments of the invention avoid drawbacks of interference of leakage current generation in the prior art, or prevent utilization of larger layout area of the MOS transistor capacitor. Also, the charging operation having an adjustable charging period and an adjustable charging slope provides another soft start operation to broaden product application of the charging circuit, which can be applied to polysilicon capacitors, passive circuits or combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charging circuit comprising:
a driver circuit for receiving an input voltage to generate an initiation current;
a first current mirror comprising:
a first branch circuit for generating a first conduction current according to the input voltage and the initiation current;
a second branch circuit for generating a second conduction current according to the input voltage and the initiation current; and
a third branch circuit for generating a third conduction current according to the input voltage and the initiation current;
a second current mirror comprising:
a fourth branch circuit coupled to the first branch circuit and comprising a first channel width; and
a fifth branch circuit coupled to the second branch circuit and comprising a second channel width;
a third current mirror coupled to the first current mirror and comprising a sixth branch circuit and a seventh branch circuit for receiving the input voltage;
a switch transistor coupled to the second branch circuit of the first current mirror and the sixth branch circuit of the third current mirror for determining a conduction condition of the switch transistor according to a switch signal;
a first resistor comprising a first resistance, one end coupled to the switch transistor and another end grounded; and
a second resistor comprising a second resistance, one end coupled to the seventh branch circuit of the third current mirror and another end grounded;
wherein the first current mirror and the second current mirror are utilized to correspondingly adjust values of the first conduction current, the second conduction current and the third conduction current according to the first channel width as well as the second channel width, or the third current mirror is utilized to process the charging operation of the load circuit according to the first resistance as well as the second resistance.

2. The charging circuit of claim 1, wherein second current mirror generates a fourth conduction current and a fifth conduction current passing through the fourth branch circuit and the fifth branch circuit, respectively, according to the first conduction current, the first channel width and the second channel width.

3. The charging circuit of claim 2, wherein the first branch circuit and the second branch circuit both comprise two cascoded P-type MOS transistors, the fourth branch circuit and the fifth branch circuit both comprise two cascoded N-type MOS transistors, and a capacitive transistor comprises one end coupled to one end of a P-type MOS transistor of the first branch circuit and another end coupled to one end of a P-type MOS transistor of the second branch circuit.

4. The charging circuit of claim 3, wherein a calculational result is obtained from subtracting the fifth conduction current from a sum of the second conduction current and the third conduction current such that the calculational result is utilized to process the charging operation of the load circuit.

5. The charging circuit of claim 4, wherein the first current mirror further comprises an eighth branch circuit comprising two cascode P-type MOS transistors.

6. The charging circuit of claim 5, further comprising a bipolar transistor comprising an emitter coupled to one end of the eighth branch circuit, a base coupled to the load circuit as well as the one end of the P-type MOS transistor of the first branch circuit, and a collector coupled to a reference voltage source.

7. The charging circuit of claim 6, wherein the bipolar transistor comprises a gain parameter.

8. The charging circuit of claim 7, wherein the gain parameter is utilized to process a current multiplication operation of the calculational result, so as to process the charging operation of the load circuit.

9. The charging circuit of claim 1, wherein a sixth conduction current and a seventh conduction current pass through the sixth branch circuit and the seventh branch circuit of the third current mirror, and the first resistance as well as the second resistance are utilized to transform the sixth conduction current and the seventh conduction current into a first output voltage and a second output voltage, so as to process the charging operation of the load circuit.

10. The charging circuit of claim 1, wherein the charging operation comprises to generate at least a charging slope for the load circuit.

11. The charging circuit of claim 10, wherein a conduction condition of the switch transistor is utilized to generate the charging slope.

12. The charging circuit of claim 10, wherein a ratio formed by the first resistance and the second resistance is utilized to adjust a slope change of the charging slope.

13. The charging circuit of claim 12, wherein the slope change of the charging slope is utilized to adjust a charging period of the charging operation.

14. The charging circuit of claim 10, wherein the charging slope comprises a single slope value without turning points.

15. The charging circuit of claim 1, wherein the sixth branch circuit comprises a first P-type MOS transistor, and the seventh branch circuit comprises a second P-type MOS transistor.

16. The charging circuit of claim 15, wherein the switch transistor is an N-type MOS transistor comprising a gate coupled to a drain of the first P-type MOS transistor, a drain coupled to a drain of the second P-type MOS transistor, and a source coupled to the first resistor.

17. The charging circuit of claim 1, wherein the load circuit is a MOS transistor capacitor, a polysilicon capacitor or a passive circuit.

18. The charging circuit of claim 1, wherein the charging operation provides a soft start operation for the load circuit.

19. The charging circuit of claim 1, wherein the second branch circuit and the third branch circuit are integrated into an integration branch circuit providing an integration conduction current, and the integration conduction current is a sum of the second conduction current and the third conduction current.

* * * * *